(12) United States Patent
Zhang et al.

(10) Patent No.: US 11,848,392 B2
(45) Date of Patent: Dec. 19, 2023

(54) SOLAR CELL AND PHOTOVOLTAIC MODULE

(71) Applicant: ZHEJIANG JINKO SOLAR CO., LTD., Zhejiang (CN)

(72) Inventors: Xiaowen Zhang, Zhejiang (CN); Wenqi Li, Zhejiang (CN); Shijie Zhao, Zhejiang (CN); Ding Yu, Zhejiang (CN); Jialei Chai, Zhejiang (CN); Jie Yang, Zhejiang (CN); Menglei Xu, Zhejiang (CN)

(73) Assignee: ZHEJIANG JINKO SOLAR CO., LTD., Zhejiang (CN)

( * ) Notice: Subject to any disclaimer, the term of this patent is extended or adjusted under 35 U.S.C. 154(b) by 0 days.

(21) Appl. No.: 17/529,705

(22) Filed: Nov. 18, 2021

(65) Prior Publication Data

US 2023/0123997 A1 Apr. 20, 2023

(30) Foreign Application Priority Data

Oct. 18, 2021 (CN) .......................... 202111211518.6

(51) Int. Cl.
*H01L 31/0224* (2006.01)
*H01L 31/0216* (2014.01)
*H01L 31/028* (2006.01)

(52) U.S. Cl.
CPC .... *H01L 31/022425* (2013.01); *H01L 31/028* (2013.01); *H01L 31/02167* (2013.01)

(58) Field of Classification Search
CPC ....... H01L 31/022425; H01L 31/02167; H01L 31/028; H01L 31/0508; H01L 31/022433
See application file for complete search history.

(56) References Cited

U.S. PATENT DOCUMENTS

2009/0288709 A1* 11/2009 Iida ................. H01L 31/022425
136/265
2013/0160815 A1* 6/2013 Bettinelli ........ H01L 31/022433
438/98
(Continued)

FOREIGN PATENT DOCUMENTS

CN 103456803 A * 12/2013 ..... H01L 31/022433
CN 203423194 U 2/2014
(Continued)

OTHER PUBLICATIONS

CN-203423194-U English machine translation (Year: 2014).*
(Continued)

*Primary Examiner* — Andrew J Golden
(74) *Attorney, Agent, or Firm* — Knobbe, Martens, Olson & Bear LLP (57) ABSTRACT

Provided are a solar cell and a photovoltaic module. The solar cell includes: a silicon substrate; a passivation layer provided on a surface of the silicon substrate; a first electrode conductor at least partially arranged on the passivation layer and including a body portion and protruding portions located on two ends of the body portion; and a second electrode conductor at least partially arranged on the passivation layer and at least partially overlapping with the protruding portions. A length of each of the protruding portions in a width direction of the body portion is greater than a width of the body portion.

18 Claims, 4 Drawing Sheets

(56) References Cited

U.S. PATENT DOCUMENTS

| | | | | |
|---|---|---|---|---|
| 2013/0319516 A1* | 12/2013 | Chien | ............. | H01L 31/022433 257/E31.124 |
| 2014/0373911 A1* | 12/2014 | Lee | ................. | H01L 31/022433 136/256 |
| 2015/0090334 A1* | 4/2015 | Han | .................... | H01L 31/0201 136/256 |
| 2016/0079466 A1* | 3/2016 | Hashigami | ............ | H01L 31/068 438/98 |

FOREIGN PATENT DOCUMENTS

| | | | | |
|---|---|---|---|---|
| CN | 203617305 | U | * | 5/2014 |
| CN | 104465805 | A | | 3/2015 |
| CN | 205685945 | U | * | 11/2016 |
| CN | 111490111 | A | | 8/2020 |
| CN | 112186046 | A | | 1/2021 |
| EP | 2650923 | A1 | | 10/2013 |
| JP | 2009295715 | A | * | 12/2009 |

OTHER PUBLICATIONS

JP-2009295715-A English machine translation (Year: 2009).*
CN-103456803-A English machine translation (Year: 2013).*
CN-205685945-U English machine translation (Year: 2016).*
CN-203617305-U English machine translation (Year: 2014).*
First Office Action of Chinese Application No. 202111211518.6, dated Nov. 19, 2021, in 13 pages.
Extended European Search Report for Application No. 21208201.0, dated Apr. 8, 2022, in 9 pages.

\* cited by examiner

SOLAR CELL AND PHOTOVOLTAIC MODULE

CROSS-REFERENCE TO RELATED APPLICATIONS

The present application claims priority to Chinese Patent Application No. 202111211518.6, filed on Oct. 18, 2021, the content of which is incorporated herein by reference in its entirety.

TECHNICAL FIELD

The present disclosure relates to the field of photovoltaic technologies and, in particular, to a solar cell and a photovoltaic module.

BACKGROUND

A passivation layer of a solar cell is generally provided with a firing-through paste and a non-firing-through paste connected to each other, which, after being sintered and cured, form a local-contact metallized structure to conduct electricity.

In the related art, the firing-through paste and the non-firing-through paste are generally required to be printed on a surface of a silicon substrate during the manufacturing of the solar cell. Due to limitations of accuracy of the printing process, adhesion characteristics of the pastes and inking properties of a screen printing plate, a metallized structure formed after curing of a non-contact paste and a contact paste performs poor contact, which reduces an open-circuit voltage and conversion efficiency of the solar cell.

SUMMARY

In view of the above, a solar cell is provided according to the present disclosure, so as to solve the problems of the low open-circuit voltage and low conversion efficiency of the solar cell in the related art.

In an aspect of the present disclosure, a solar cell is provided. The solar cell includes: a silicon substrate; a passivation layer provided on a surface of the silicon substrate; a first electrode conductor at least partially arranged on the passivation layer and including a body portion and protruding portions located on two ends of the body portion; and a second electrode conductor at least partially arranged on the passivation layer and at least partially overlapping with the protruding portions. A length of each of the protruding portions in a width direction of the body portion is greater than a width of the body portion.

In one or more embodiments, an overlapping area S1 between the first electrode conductor and the second electrode conductor accounts for 5% to 25% of a total area of the first electrode conductor.

In one or more embodiments, S1 ranges from 0.001 $\mu m^2$ to 0.05 $\mu m^2$.

In one or more embodiments, an area S2 of an orthographic projection of the second electrode conductor on the silicon substrate ranges from 0.05 $\mu m^2$ to 0.1 $\mu m^2$.

In one or more embodiments, an area of an orthographic projection of each of the protruding portions on the silicon substrate is S3, an overlapping area between each of the protruding portions and the body portion is S4, and an area of S3 subtracted by S4 ranges from 0.002 $\mu m^2$ to 0.1 $\mu m^2$.

In one or more embodiments, an area of an orthographic projection of the body portion on the silicon substrate is S5, and S5 ranges from 0.05 $\mu m^2$ to 0.1 $\mu m^2$.

In one or more embodiments, the first electrode conductor penetrates the passivation layer and contacts the silicon substrate, and the second electrode conductor does not penetrate the passivation layer and is isolated from the silicon substrate In one or more embodiments, the first electrode conductor is formed by curing of a firing-through paste, and the second electrode conductor is formed by curing of a non-firing-through paste.

In one or more embodiments, the second electrode conductor penetrates the passivation layer and contacts the silicon substrate, and the first electrode conductor does not penetrate the passivation layer and is isolated from the silicon substrate.

In one or more embodiments, the second electrode conductor is formed by curing of a firing-through paste, and the first electrode conductor is formed by curing of a non-firing-through paste.

In one or more embodiments, an orthographic projection of at least one of the protruding portions on the passivation layer has at least one of the following shapes: a circle, an ellipse, a semicircle, a trapezoid or a square.

In one or more embodiments, both the first electrode conductor and the second electrode conductor penetrate the passivation layer and contact the silicon substrate.

In another aspect of the present disclosure, a photovoltaic module is provided, the photovoltaic module includes at least one solar cell, and one or more of the at least one solar cell includes a silicon substrate; a passivation layer provided on a surface of the silicon substrate; a first electrode conductor at least partially arranged on the passivation layer and including a body portion and protruding portions located on two ends of the body portion; and a second electrode conductor at least partially arranged on the passivation layer and at least partially overlapping with the protruding portions. A length of each of the protruding portions in a width direction of the body portion is greater than a width of the body portion.

Other features and advantages of the embodiments of the present disclosure will be set forth in the specification which follows and in part will become apparent from the specification or may be learned from practice of the present disclosure. The objectives and other advantages of the embodiments of the present disclosure may be realized and attained by the structure particularly pointed out in the specification and the accompanying drawings.

BRIEF DESCRIPTION OF DRAWINGS

In order to better illustrate the technical solutions in embodiments of the present disclosure, the accompanying drawings used in the description of the embodiments will be briefly introduced below. It is apparent that, the accompanying drawings in the following description are only some embodiments of the present disclosure, and other drawings can be obtained by those of ordinary skill in the art from the provided drawings without creative efforts.

The accompanying drawings herein, which are incorporated in and constitute a part of this specification, illustrate embodiments consistent with the present disclosure and, together with the specification, serve to explain principles of the present disclosure.

DESCRIPTION OF EMBODIMENTS

For better illustrating technical solutions of the present disclosure, embodiments of the present disclosure will be described in detail as follows with reference to the accompanying drawings.

It is to be noted that the described embodiments are merely some of rather than all of the embodiments of the present disclosure. All other embodiments acquired by those skilled in the art without creative efforts based on the embodiments of the present disclosure shall fall within the protection scope of the present disclosure.

The terms used herein in the embodiments of the present disclosure are only for the purpose of describing specific embodiments, and are not intended to limit the present disclosure. As used in the embodiments of the present disclosure and the appended claims, the singular forms of "a/an", "the", and "said" are intended to include plural forms, unless otherwise clearly indicated in the context.

It is to be understood that the term "and/or" used herein describes only an association relationship between associated objects and represents that three relationships may exist. For example, A and/or B may represent the following three cases: only A exists, both A and B exist, and only B exists. In addition, the character "/" generally indicates an "or" relationship between the associated objects.

It is to be noted that terms indicating orientations such as "above", "below", "left" and "right" described in the embodiments of the present disclosure are used to describe the orientations with reference to the drawings, and should not be construed as a limitation on the embodiments of the present disclosure. In addition, in the context, it is to be further understood that when an element is referred as being "above" or "below" another element, the element can be directly located "above" or "below" the other element or indirectly connected "above" or "below" the other element through an intermediate element.

In order to make the description of the following embodiments clear and concise, a brief introduction to related concepts or technologies is given at follows.

Power Generation of Solar Cell

A basic structure of a solar cell is formed by bonding of a P-type semiconductor and an N-type semiconductor, which is referred to as a PN junction. When sunlight is incident to a normal semiconductor (such as silicon), electron-hole pairs may be created, but they quickly combine and convert energy into photons or phonons (heat). The photons are related to energy, while the phonons are related to momentum. Therefore, electrons and holes have very short lifetime. In the P-type semiconductor, light-generated holes have longer lifetime due to a higher hole density. Similarly, in the N-type semiconductor, the electrons have longer lifetime. At a junction between the P-N semiconductors, a built-in electric field pointing from N to P may be generated due to diffusion caused by different effective carrier concentrations. Therefore, when the photons are absorbed by a semiconductor at the junction, the resulting electrons may be moved to the N-type semiconductor under the electric field and the holes are moved to the P-type semiconductor, thereby accumulating charges on two sides. An electric current may be generated in the case of a wire connection. A challenge for the solar cell is how to collect the resulting electron-hole pairs prior to recombination thereof.

Recombination

Recombination refers to a recombination process occurring on a surface of a silicon substrate. Lifetime of minority carriers in the silicon substrate is greatly affected by conditions of a surface of the silicon substrate, because the surface of the silicon substrate may have the following three conditions. (1) A lattice structure extending from silicon crystal to the surface is interrupted on the surface, surface atoms have suspended bonds, and electrons of the silicon atoms arrayed to edges cannot form covalent bonds. Therefore, surface energy levels of a surface state may appear, in which the energy levels close to a band gap center are effective surface recombination centers. (2) Cutting damages on the surface of the silicon substrate during a scribing process may lead to many defects and lattice distortion, and increase more recombination centers. (3) Foreign impurities with positive and negative charges adsorbed on the surface of the silicon substrate may also become recombination centers.

The recombination may bring serious adverse effects to photoelectric performance of the solar cell and may significantly reduce photoelectric conversion efficiency. In practical situations, non-radiative recombination and carrier transport losses caused by non-uniformly distributed defect centers restrict improvements in the efficiency. The former reduces non-equilibrium carrier concentrations in two energy bands, resulting in quasi-Fermi level splitting and a decrease in maximum open-circuit voltage (VOC), while the latter represents losses of junction carriers during transport to electrodes. Therefore, reducing the non-radiative recombination and carrier transfer losses is an important issue in current design of high-performance solar cells.

Embodiments are described below based on a structure of a solar cell according to the present disclosure.

During the manufacturing of a solar cell 100, firing-through pastes and non-firing-through pastes are required to be printed on a passivation layer 11 of a silicon substrate 1. The firing-through pastes are required to contact the non-firing-through pastes. In this way, after the two are sintered and cured, the firing-through pastes penetrate the passivation layer 11 and form ohmic contact with the silicon substrate 1, while the non-firing-through pastes do not burn through the passivation layer 11 and are isolated from the silicon substrate 1. Since the firing-through pastes contact the non-firing-through pastes, a local metallized structure formed by curing of the firing-through pastes and the non-firing-through pastes can be electrically conductive, and carriers can also be transferred from the silicon substrate 1 to the local metallized structure.

The firing-through pastes and the non-firing-through pastes are connected by alternate arrangement during the printing, and are printed in a sequence. In some embodiments, the non-firing-through pastes are printed to a surface of the passivation layer 11 of the silicon substrate 1 via a screen printing plate. In this case, the non-firing-through pastes are spaced in a first direction 10. Then, the firing-through pastes are required to be printed to the surface of the passivation layer 11 of the silicon substrate 1 via the screen printing plate, and the firing-through pastes connect together the non-firing-through pastes spaced in the first direction 10.

However, two printing operations are required, and positioning accuracy is not high enough in the screen printing process. Therefore, when the firing-through pastes are printed to the surface of the passivation layer 11 of the silicon substrate 1 via the screen printing plate, the firing-through pastes are prone to deviation in a second direction 20 (e.g., a direction perpendicular to the first direction 10), which may lead to complete disconnection of the firing-through pastes from the non-firing-through pates, thereby bringing adverse effects to normal use of the solar cell 100.

The pastes and a silicon substrate are in poor contact due to the above process conditions and due to limitations of adhesion characteristics of the pastes and inking properties of the screen printing plate. As a result, the firing-through pastes and the non-firing-through pastes are prone to poor contact during the printing. In other words, the firing-through pastes and the non-firing-through pastes are prone to disconnection or have an excessive small contact area. In this case, contact resistance of the local metallized structure formed after sintering and curing is large, and the carriers on the silicon substrate 1 cannot be successfully transferred to the local metallized structure on the surface of the passivation layer 11, leading to reduction of the conversion efficiency of the solar cell 100.

Figure 1:
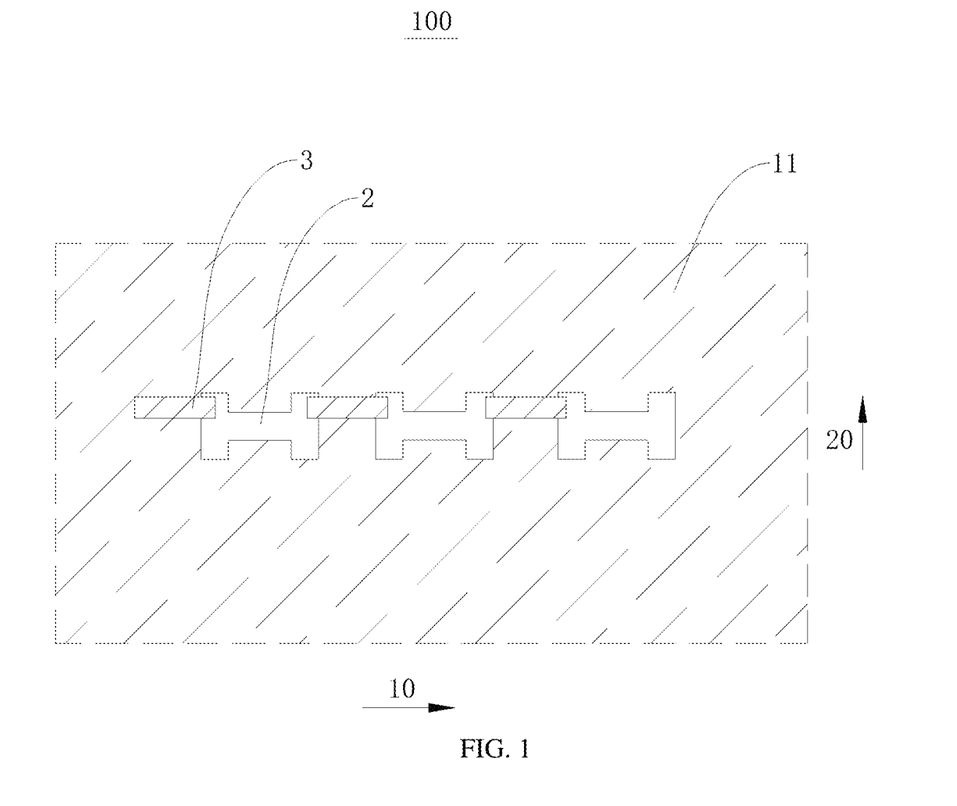
FIG. 1 is a schematic structural diagram of a solar cell according to an embodiment of the present disclosure.
Figure 2:
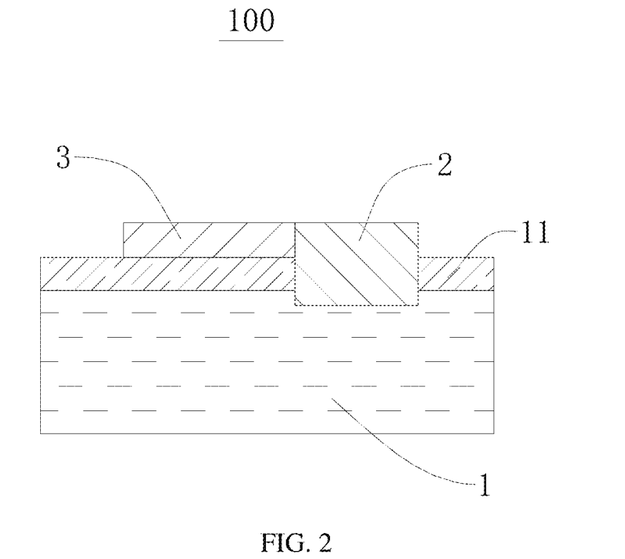
FIG. 2 is a schematic sectional view of the solar cell according to an embodiment of the present disclosure.

In order to ensure sufficient contact conditions, a solar cell 100 is provided. Referring to FIG. 1 and FIG. 2, the solar cell 100 includes a silicon substrate 1, a first electrode conductor 2 and a second electrode conductor 3. A surface of the silicon substrate 1 is provided with a passivation layer 11. The first electrode conductor 2 is arranged at least partially on the passivation layer 11. The first electrode conductor 2 includes a body portion 21 and protruding portions 22 on two ends of the body portion 21. The body portion 21 may be formed as a straight line shape, and the protruding portion 22 may be formed as a dot shape. Lengths of the protruding portions 22 in a width direction of the body portion 21 are each greater than a width of the body portion 21. By taking extension of the body portion 21 along the first direction 10 as an example, the width direction of the body portion 21 is the second direction 20 perpendicular to the first direction 10. The arrangement of the protruding portions 22 on the two ends of the body portion 21 enables larger coverage of two ends of the first electrode conductor 2 in the second direction 20, so as to improve stability of the contact between the first electrode conductor 2 and the second electrode conductor 3.

The second electrode conductor 3 is arranged at least partially on the passivation layer 11. At least a part of the second electrode conductor 3 overlaps with the protruding portions 22.

One of the first electrode conductor 2 and the second electrode conductor 3 penetrates the passivation layer 11 and contacts the silicon substrate 1, while the other does not penetrate the passivation layer 11 and is isolated from the silicon substrate 1.

In some embodiments, the first electrode conductor 2 penetrates the passivation layer 11 and contacts the silicon substrate 1. In this case, the first electrode conductor 2 has a part protruding from the passivation layer 11 and a part penetrating the passivation layer 11 and contacting the silicon substrate 1. The second electrode conductor 3 does not penetrate the passivation layer 11 and is isolated from the silicon substrate 1. The first electrode conductor 2 may be formed by curing of a firing-through paste, and the second electrode conductor 3 may be formed by curing of a non-firing-through paste. After the curing, the first electrode conductor 2 and the second electrode conductor 3 are connected to each other to form an entire local metallized structure.

In some embodiments, the second electrode conductor 3 penetrates the passivation layer 11 and contacts the silicon substrate 1. In this case, the second electrode conductor 3 has a part protruding from the passivation layer 11 and a part penetrating the passivation layer 11 and contacting the silicon substrate 1. The first electrode conductor 2 does not penetrate the passivation layer 11 and is isolated from the silicon substrate 1. The second electrode conductor 3 may be formed by curing of a firing-through paste, and the first electrode conductor 2 may be formed by curing of a non-firing-through paste. After the curing, the first electrode conductor 2 and the second electrode conductor 3 are connected to each other to form an entire local metallized structure.

In some embodiments, both the first electrode conductor 2 and the second electrode conductor 3 penetrate the passivation layer 11 and contact the silicon substrate 1. Both the first electrode conductor 2 and the second electrode conductor 3 may be formed by curing of a firing-through paste. After the curing, the first electrode conductor 2 and the second electrode conductor 3 are connected to each other to form an entire local metallized structure.

Referring to FIG. 2, the silicon substrate 1 may be an n-type semiconductor or a p-type semiconductor. The surface of the silicon substrate 1 may be provided with an n+ or p+ diffusion layer, and a surface of the diffusion layer may be passivated by a silicon nitride or alumina/silicon nitride film layer to form the passivation layer 11. The surface of the silicon substrate 1 may be a textured surface and an etched surface.

Main components of the firing-through paste are given below as an example: silver powder (or any metal powder), glass (flake-like or powder-like), an organic phase or an organic solvent. During the sintering, the glass component of the firing-through paste may destroy the passivation layer 11, and the conductor component of the firing-through paste may form ohmic contact with the silicon substrate. Main components of the non-firing-through paste are given below as an example: silver powder (or any metal powder), glass (with a content less than the glass in the firing-through paste), an organic phase or an organic solvent. During the sintering, the glass component of the non-firing-through paste is less, which is difficult to destroy the passivation layer 11, and the conductor component of the non-firing-through paste may be isolated from the silicon substrate.

The first electrode conductor 2 includes a body portion 21 and protruding portions 22 on two ends of the body portion 21. Lengths of the protruding portions 22 in a width direction of the body portion 21 are each greater than a width of the body portion 21. That is, the body portion 21 and the protruding portions 22 on the two ends of the body portion 21 roughly form an "I"-shaped structure. At least a part of the second electrode conductor 3 overlaps with the protruding portions 22. In this way, the first electrode conductor 2 and the second electrode conductor 3 are connected to each other to form an entire local metallized structure, with small contact resistance and good conductivity, which increases an open-circuit voltage of the solar cell 100, thereby improving the conversion efficiency of the solar cell 100.

Figure 5:
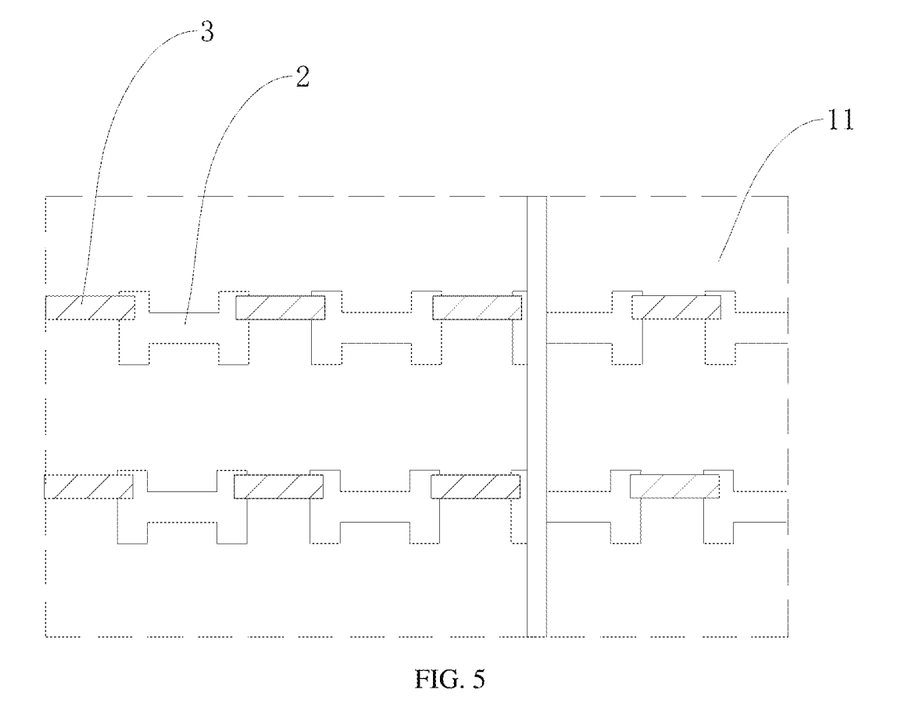
FIG. 5 is a schematic top view of a cell screen printing plate according to an embodiment of the present disclosure.

FIG. 5 is a schematic top view of a cell screen printing plate according to an embodiment of the present disclosure. As shown in FIG. 5, a mutual relationship between positions of the first electrode conductor 2 and the second electrode conductor 3 in the solar cell screen printing plate is shown, the first electrode conductor 2 and the second electrode conductor 3 in the figure overlap in turn to form an array structure. Each two adjacent rows have at least one busbar to connect the two. A busbar may include a primary electrode and a secondary electrode with different widths and lengths. The primary electrode enables a plurality of rows of first electrode conductors 2 and second electrode conductors 3 to overlap in turn to form connected array structures. The primary electrode and the secondary electrode may cross each other or be perpendicular to each other. The secondary electrode may connect a plurality of primary electrodes. Currents on the solar cell are converged together and outputted to the outside.

In some embodiments, an overlapping area S1 between the first electrode conductor 2 and the second electrode conductor 3 accounts for 5% to 25% of a total area of the first electrode conductor 2.

Figure 3:
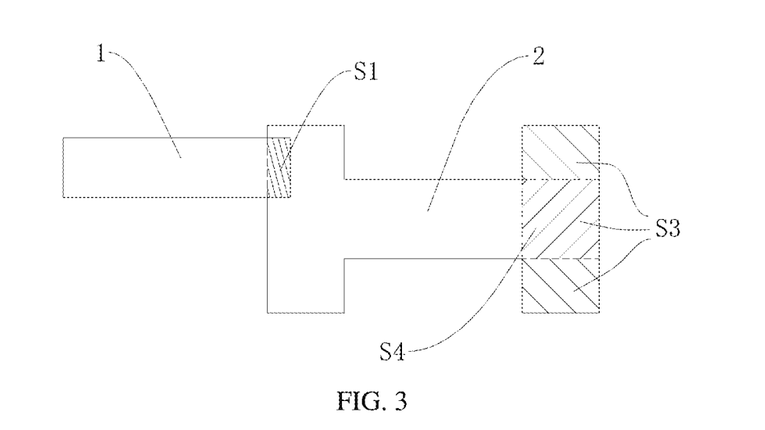
FIG. 3 is a schematic diagram of a connection between a first electrode conductor and a second electrode conductor in the solar cell according to an embodiment of the present disclosure.

Referring to FIG. 3, the firing-through paste and the non-firing-through paste may form large recombination after overlapping, which may bring adverse effects to overall conversion efficiency of the solar cell 100. Therefore, in order to reduce the influence of the recombination as much as possible while ensuring the contact, in some embodiments, the overlapping area S1 is defined as 5% to 25% of the total area of the first electrode conductor 2. For example, the overlapping area S1 may be 5%, 10%, 15%, 20% and 25% of the total area of the first electrode conductor 2. When the overlapping area S1 is 5% to 25% of the total area of the first electrode conductor 2, the open-circuit voltage of the solar cell 100 may be increased by about 1.1%.

It is to be noted that, when calculating areas such as S1, S2, S3, S4 and S5, an orthographic projection method or measured by a 3D surface area measuring instrument can be adopted. For example, the area may be obtained based on an image-processing-based method.

In some embodiments, considering that each first electrode conductor in some products has a basically equal area, in order to more quickly characterize or test a relationship between areas of the first electrode conductor and the second electrode conductor, the total area of the first electrode conductor may be calculated by measuring the area of the first electrode conductor as a reference and then by multiplying the obtained area of the first electrode conductor by the number of the first electrode conductor. A similar measurement method may be adopted for the second electrode conductor, which is not described in detail herein.

Experimental results show that when the overlapping area S1 between the first electrode conductor 2 and the second electrode conductor 3 accounts for less than 5% of the total area of the first electrode conductor 2, the contact resistance is large, which brings adverse effects to the open-circuit voltage of the solar cell 100, thereby reducing the conversion efficiency of the solar cell 100. When the overlapping area S1 between the first electrode conductor 2 and the second electrode conductor 3 accounts for more than 25% of the total area of the first electrode conductor 2, the firing-through paste and the non-firing-through paste form large recombination after overlapping, which may also reduce the open-circuit voltage and the conversion efficiency of the solar cell 100.

In some embodiments, S1 ranges from 0.001 $\mu m^2$ to 0.05 $\mu m^2$.

Referring to FIG. 3, the inventor has found through experiments that, when S1 ranges from 0.001 $\mu m^2$ to 0.05 $\mu m^2$, for example, S1 may be 0.001 $\mu m^2$, 0.002 $\mu m^2$, 0.003 $\mu m^2$, 0.004 $\mu m^2$ or 0.005 $\mu m^2$. The above configuration can reduce the influence of the recombination as much as possible while ensuring the contact, thereby increasing the open-circuit voltage and the conversion efficiency of the solar cell 100. It may be understood that S1 is an overlapping area between the first electrode conductor 2 and the second electrode conductor 3, an excessive large overlapping area of the two may also influence an irradiation range of light hitting the solar cell. Therefore, in order to ensure power generation efficiency, a preferred area range of S1 is defined.

In some embodiments, an area S2 of projection of the second electrode conductor 3 on the silicon substrate 1 ranges from 0.05 $\mu m^2$ to 0.1 $\mu m^2$.

Referring to FIG. 1, the area S2 of projection is limited to 0.05 $\mu m^2$ to 0.1 $\mu m^2$. For example, the area S2 of projection may be 0.05 $\mu m^2$, 0.06 $\mu m^2$, 0.07 $\mu m^2$, 0.08 $\mu m^2$, 0.09 $\mu m^2$ or 0.1 $\mu m^2$. If the area of projection of the second electrode conductor 3 on the silicon substrate 1 is larger, occlusion shielded area of the solar cell 100 is larger, which may significantly influence the power generation efficiency of the solar cell 100. Moreover, when the second electrode conductor 3 is formed by sintering and curing of the firing-through paste, large-area damages of the firing-through paste to the passivation layer 11 may also lead to the reduction of the open-circuit voltage of the solar cell 100, which may bring adverse effects to the conversion efficiency of the solar cell 100.

Experimental results show that when the area S2 of projection is more than 0.1 $\mu m^2$, the solar cell 100 has a larger shielded area. When the area S2 of projection is less than 0.05 $\mu m^2$, a forming range of the second electrode conductor 3 is too narrow, which may bring adverse effects to the contact with the first electrode conductor 2 and easily lead to poor contact therebetween.

In some embodiments, an area of projection of each of the protruding portions 22 on the silicon substrate 1 is S3, an overlapping area between each of the protruding portions 22 and the body portion 21 is S4, and an area of S3 subtracted by an area of S4 ranges from 0.002 $\mu m^2$ to 0.1 $\mu m^2$.

Referring to FIG. 3, it may be understood that the area of S3 subtracted by an area S4 is an area of a part of the protruding portion 22 protruding from the body portion 21. In some embodiments, the area of S3 subtracted by the area S4 may be 0.002 $\mu m^2$, 0.004 $\mu m^2$, 0.006 $\mu m^2$, 0.008 $\mu m^2$, 0.01 $\mu m^2$, 0.03 $\mu m^2$, 0.05 $\mu m^2$, 0.07 $\mu m^2$, 0.09 $\mu m^2$ or 0.1 $\mu m^2$. Under a precondition that other conditions remain unchanged, the larger the area of the protruding portion 22 protruding formed the body portion 21 is, the easier the contact is formed between the second electrode conductor 3 and the protruding portion 22. As a result, an error-tolerant rate can be increased during screen printing of the paste, so as to ensure the contact between the firing-through paste and the non-firing-through paste. However, the larger the area of the part of the protruding portion 22 protruding beyond the body portion 21, the smaller a light-receiving area of the solar cell 100. Therefore, in some embodiments, the area of S3 minus S4 is limited to 0.002 $\mu m^2$ to 0.1 $\mu m^2$, which may increase the light-receiving area of the solar cell 100 while ensuring the contact between the second electrode conductor 3 and the protruding portion 22, thereby improving the conversion efficiency of the solar cell 100.

In some embodiments, an area S5 of projection of the body portion 21 on the silicon substrate 1 is S5, and S5 ranges from 0.05 $\mu m^2$ to 0.1 $\mu m^2$.

Figure 4:
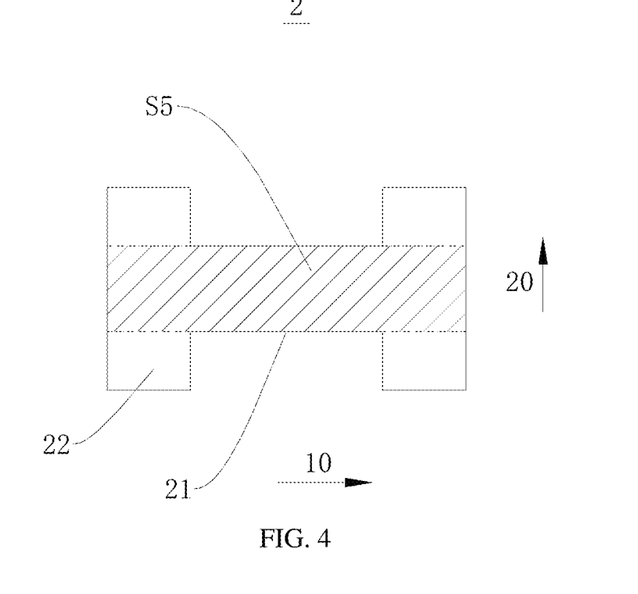
FIG. 4 is a schematic structural diagram of the first electrode conductor of the solar cell according to an embodiment of the present disclosure.

Referring to FIG. 4, an area of projection of the body portion 21 on the silicon substrate 1 is S5. In some embodiments, S5 is 0.05 $\mu m^2$, 0.06 $\mu m^2$, 0.07 $\mu m^2$, 0.08 $\mu m^2$, 0.09

μm² or 0.1 μm². The body portion 21 may cover a light-receiving region of the solar cell 100. The limitation on S5 may prevent an excessive large light-receiving region of the body portion 21 on the solar cell 100, preventing the influence on the power generation efficiency of the solar cell 100.

Experimental results show that when S5 is more than 0.1 μm², the light-receiving region of the body portion 21 on the solar cell 100 is too large, which greatly reduces photovoltaic power generation efficiency of the solar cell. When S5 is less than 0.05 μm², the light-receiving region of the body portion 21 is too narrow, which is prone to disconnection during the printing and sintering, thereby leading to the entire disconnection of the circuit and affecting production yield of the solar cell 100.

In some embodiments, when the first electrode conductor 2 penetrates the passivation layer 11 and contacts the silicon substrate 1 and the second electrode conductor 3 does not penetrate the passivation layer 11 and is isolated from the silicon substrate 1, the first electrode conductor 2 is formed by curing of the firing-through paste, and the second electrode conductor 3 is formed by curing of the non-firing-through paste.

In some embodiments, when the second electrode conductor 3 penetrates the passivation layer 11 and contacts the silicon substrate 1 and the first electrode conductor 2 does not penetrate the passivation layer 11 and is isolated from the silicon substrate 1, the second electrode conductor 3 is formed by curing of the firing-through paste, and the first electrode conductor 2 is formed by curing of the non-firing-through paste.

Referring to FIG. 2, after sintered and cured, the firing-through paste may penetrate the passivation layer 11 and contact the silicon substrate 1. After being sintered and cured, the non-firing-through paste does not penetrate the passivation layer 11 and is isolated from the silicon substrate 1. After the curing, the first electrode conductor 2 and the second electrode conductor 3 are connected to each other to form an entire local metallized structure, so that carriers can be transferred from the silicon substrate 1 to the surface of the solar cell 100 along the local metallized structure. A mutual position relationship between the first electrode conductor 2 and the second electrode conductor 3 may be the first electrode conductor 2 covering the second electrode conductor 3 or the second electrode conductor 3 covering the first electrode conductor 2. In either stacking manner, they overlap and then melt into an entire conductive structure.

In some embodiments, a projection of the protruding portion 22 on the passivation layer 11 is in at least one of the following shapes: a circle, an ellipse, a semicircle, a trapezoid or a square.

Referring to FIG. 1, the shape of the protruding portion 22 may be designed according to an actual situation. The protruding portion 22 may be in a shape of a rectangle, with a long-side direction of the rectangle perpendicular to an extension direction of the body portion 21. In this way, good contact between the first electrode conductor 2 and the second electrode conductor 3 can be ensured.

In some embodiments, the solar cell includes a silicon substrate and a plurality of first electrode conductors and a plurality of second electrode conductors arranged on the silicon substrate. The first electrode conductors contact and connect the silicon substrate. The second electrode conductors are connected to the first electrode conductors. Two adjacent ones of the first electrode conductors are connected by one of the second electrode conductors. A ratio x of a total area of the first electrode conductors to a total area of the second electrode conductors satisfies 30%≤x≤70% where x=X1×m/(X1×m+X2×n), X1 denotes an area of a single one of the first electrode conductors, m denotes a number of the first electrode conductors on the solar cell per unit, X2 denotes an area of a single one of the second electrode conductors, and n denotes a number of the second electrode conductors on the solar cell per unit.

This design can more effectively reduce a recombination current in a metallized region and improve the solar cell conversion efficiency. In addition, since manufacturing material costs of a second electrode are lower than those of a first electrode, during manufacturing of the solar cell, manufacturing costs of the solar cell may be reduced after part of the second electrode is replaced with the first electrode.

In some embodiments, m is greater than or equal to 600, and n is greater than or equal to 599.

In some embodiments, a width of the first electrode is greater than or equal to a width of the second electrode.

In some embodiments, the width of the second electrode is greater than or equal to 20 μm and is less than or equal to 45 μm.

A photovoltaic module is provided according to some embodiments of the present disclosure. The photovoltaic module includes the solar cell 100 described above (e.g., FIGS. 1-4), which is not repeated herein. The photovoltaic module may include a plurality of solar cells 100 connected in series or in parallel.

The solar cell 100 in the photovoltaic module may be a P-type solar cell or an N-type solar cell. The solar cell includes a silicon substrate 1 and a plurality of first electrode conductors 2 and second electrode conductors 3 arranged on the silicon substrate 1. The first electrode conductor 2 and the second electrode conductor 3 can collect and extract electrons generated by a photo-generating volt effect, and are used as a hub of electric energy of the solar cell. According to actual design requirements, the first electrode conductor 2 and the second electrode conductor 3 may be arranged on a front surface or a rear surface of the silicon substrate 1. In some embodiments, the silicon substrate 1 is a passivated semiconductor silicon substrate. The semiconductor silicon substrate may be made of monocrystalline silicon, polycrystalline silicon, microcrystalline silicon or the like. The passivated semiconductor silicon substrate has a passivation layer covering a surface thereof. The passivation layer may be made of silicon nitride, alumina or silicon oxynitride. The passivation layer may be of a single-layer structure or a multi-layer structure. The multi-layer structure may include a first passivation layer, an antireflection layer and so on. The passivation layer may be composed of a silicon nitride film, a hydrogen-containing silicon nitride film (i.e. SiNx:H antireflective passivation thin film), a silicon oxide film, a silicon oxynitride film and an aluminum oxide film, or may be of a multi-layer structure obtained by a combination of any two or more of such films. The arrangement of the passivation layer may reduce reflection of the sunlight from the solar cell, but more importantly, play a role of passivation.

The first electrode conductor 2 and the second electrode conductor 3 may be made of metal materials with good conductivity, such as silver or aluminum. The first electrode conductor 2 and the second electrode conductor 3 are configured to collect currents. Two adjacent first electrode conductors 2 are connected by a second electrode conductor 3. In some embodiments, local contact electrodes are used in a region of ohmic contact of the first electrode conductor 2 and the second electrode conductor 3 with the silicon substrate 1, which effectively reduces the recombination current in the metallized region and improves the solar cell conversion efficiency.

For the solar cell 100 described in the present disclosure, shapes and structures of the first electrode conductor 2 and the second electrode conductor 3 are arranged, which can effectively reduce the serial resistance, increase the open-circuit current and reduce the power loss, and at the same time, reduce the solar cell power loss caused by impossible convergence of currents after formation of electrode breakage due to poor cell printing.

Some embodiments of the structure of the photovoltaic module are illustrated below.

A stack structure of "surface light panel/packaging material/solar cell 100/packaging material/backlight panel" is generally used in the photovoltaic module. In use, one side of the surface light panel of the photovoltaic module faces the light, and one side of the backlight panel faces away from the light. The light passes through the surface light panel and irradiates on the solar cell 100, and the photovoltaic module generates power normally. The surface light panel is generally made of transparent glass, the backlight panel is made of transparent glass or polymer backplane, and the packaging material is generally an adhesive film. The transparent glass is mainly embossed glass (surface embossed) or float glass (surface embossed). Patterned structures are designed on inner surfaces of the surface light panel and the backlight panel, which may further diffuse sunlight reflected from the solar cell 100/solder strip/solar cell 100 gap and other regions inside the photovoltaic module, or sunlight incident at a solar cell gap, back to the solar cell 100 to realize secondary utilization of the sunlight, so as to improve the power of the photovoltaic module to some extent.

For example, the photovoltaic module may include a surface light panel, a backlight panel, a first reflection structure and at least two solar cells 100. In some embodiments, a plurality of solar cells 100 are connected in series or in parallel. Each two adjacent solar cells 100 may be connected through a conductive metal strip, and each two adjacent solar cells 100 have a certain interval therebetween. The backlight panel and the surface light panel in the photovoltaic module are arranged opposite. In some embodiments, the photovoltaic module includes a surface light panel, a packaging material, a solar cell 100, a packaging material and a backlight panel sequentially arranged from top to bottom.

The packaging material may include an ethylene-vinyl acetate copolymer (EVA). EVA is a thermosetting hot melt adhesive, has no viscosity at room temperature, and is easy to operate, which becomes completely transparent after melting bonding and crosslinking curing under hot pressing in a certain condition. The packaging material may separate the fragile solar cell 100 from the surface light panel and the backlight panel, and play certain roles of cushioning and damping, which is conducive to enhancing structural strength and the service life of the photovoltaic module.

The backlight panel may be made of Tedlar Polyster Tedlar (TPT), Polyethylene terephthalate (PET), transparent glass, or the like. The TPT is of a three-layer composite structure of Tedlar/Polyster/Tedlar. The PET is of a mono-layer polyester structure. The backlight panel is used on the back surface of the module as backside protection and electrical insulation, mainly for resistance to environmental erosion. The backlight panel may be in a white color, so that the backlight panel can reflect the sunlight to some extent and improve the efficiency of power generation.

Each solar cell 100 is tiled between the surface light panel and the backlight panel. Each solar cell 100 is provided with a solder strip. The solder strip, also referred to as a tin-plated copper strip or a tin-coated copper strip, or an interconnected strip, is mainly configured to for connections between the solar cells 100, playing an important role in conduction and electrification.

In some embodiments, the photovoltaic module further includes a frame. The frame may be made of an aluminum alloy or stainless steel. When the frame is made of aluminum alloy, the frame has good strength and corrosion resistance. The frame may support and protect the entire cell panel. The photovoltaic module may also be connected to an external photovoltaic bracket through the frame. A plurality of photovoltaic modules may be connected together to form a photovoltaic power station.

In some embodiments, the photovoltaic module further includes a junction box. After positive and negative poles of a solar cell module are extracted from a rear surface, a special electrical connection box is needed to realize a connection to an external circuit. The junction box may also protect a power generation system of the entire cell panel, acting as a current transfer station. When the solar cell 100 is short-circuited, a short-circuited cell string may be automatically disconnected by using the junction box.

In order to ensure the service life, the junction box may be made from engineering plastic injection molding or provided with an anti-aging and anti-ultraviolet radiation agent, to ensure that the module in the outdoor long-term use does not deteriorate and crack. A wiring terminal may be made of electrolytic copper coated with nickel to ensure the reliability of electrical conduction and connection.

The solar cell 100 applied to the photovoltaic module has low serial resistance, a high open-circuit current and low power loss, reduces a reject ratio during the printing, and prevents power loss caused by impossible convergence of currents after formation of electrode breakage. Therefore, the photovoltaic module has a characteristic of high power generation efficiency.

The above are only preferred embodiments of the present disclosure and are not intended to limit the present disclosure. Any modifications, equivalent substitutions, improvements and the like made within the principle of the present disclosure should fall within the protection scope of the present disclosure.

What is claimed is:

1. A solar cell, comprising:
   a silicon substrate;
   a passivation layer provided on a surface of the silicon substrate;
   a plurality of first electrode conductors, spaced apart from each other and contacting the silicon substrate by penetrating the passivation layer; and
   a plurality of second electrode conductors, spaced apart from each other,
   wherein the plurality of first electrode conductors are connected alternately with the plurality of second electrode conductors on a same side of the solar cell,
   wherein each of the plurality of first electrode conductors comprises a body portion, a first protruding portion, and a second protruding portion, wherein the first protruding portion and the second protruding portion are located on two ends of the body portion, wherein a length of each of the first and second protruding portions in a width direction of the body portion is greater than a width of the body portion, wherein each of the first and second protruding portions comprises a first part located on a first side of the body portion and a second part located on a second side of the body portion,
wherein a second electrode conductor of the plurality of second electrode conductors comprises a first portion, a second portion, and a third portion, the first portion is in direct contact with the first part of the first protruding portion of one first electrode conductor of the plurality of first electrode conductors, the second portion is in direct contact with the first part of the second protruding portion of another first electrode conductor of the plurality of first electrode conductors, and the third portion is in direct contact with the passivation layer,
wherein, along the width direction of the body portion, a width of the second electrode conductor is less than a width of each of the first and second protruding portions,
wherein the body portion of each first electrode conductor contacts the silicon substrate by penetrating the passivation layer, and
wherein the plurality of second electrode conductors do not penetrate the passivation layer and are isolated from the silicon substrate.

2. The solar cell according to claim 1, wherein an overlapping area S1 between a first electrode conductor of the plurality of first electrode conductors and a second electrode conductor of the plurality of second electrode conductors accounts for 5% to 25% of a total area of the first electrode conductor of the plurality of first electrode conductors.

3. The solar cell according to claim 2, wherein S1 ranges from 0.001 $\mu m^2$ to 0.05 $\mu m^2$.

4. The solar cell according to claim 1, wherein an area S2 of an orthographic projection of the second electrode conductor of the plurality of second electrode conductors on the silicon substrate ranges from 0.05 $\mu m^2$ to 0.1 $\mu m^2$.

5. The solar cell according to claim 1, wherein an area of an orthographic projection of each of the first protruding portion and the second protruding portion on the silicon substrate is S3, an overlapping area between each of the first protruding portion and the second protruding portion and the body portion is S4, and an area of S3 subtracted by S4 ranges from 0.002 $\mu m^2$ to 0.1 $\mu m^2$.

6. The solar cell according to claim 1, wherein an area of an orthographic projection of the body portion on the silicon substrate is S5, and S5 ranges from 0.05 $\mu m^2$ to 0.1 $\mu m^2$.

7. The solar cell according to claim 1, wherein the plurality of first electrode conductors are formed by curing of a firing-through paste, and the plurality of second electrode conductors are formed by curing of a non-firing-through paste.

8. The solar cell according to claim 1, wherein an orthographic projection of at least one of the first protruding portion and the second protruding portion on the passivation layer has at least one of the following shapes: a circle, an ellipse, a semicircle, a trapezoid or a square.

9. A photovoltaic module, wherein the photovoltaic module comprises at least one solar cell, and one or more of the at least one solar cell comprises:
a silicon substrate;
a passivation layer provided on a surface of the silicon substrate;
a plurality of first electrode conductors, spaced apart from each other and contacting the silicon substrate by penetrating the passivation layer; and
a plurality of second electrode conductors, spaced apart from each other,
wherein the plurality of first electrode conductors are connected alternately with the plurality of second electrode conductors on a same side of the at least one solar cell,
wherein each of the plurality of first electrode conductors comprises a body portion, a first protruding portion, and a second protruding portion, wherein the first protruding portion and the second protruding portion are located on two ends of the body portion, wherein a length of each of the first and second protruding portions in a width direction of the body portion is greater than a width of the body portion, wherein each of the first and second protruding portions comprises a first part located on a first side of the body portion and a second part located on a second side of the body portion,
wherein a second electrode conductor of the plurality of second electrode conductors comprises a first portion, a second portion, and a third portion, the first portion is in direct contact with the first part of the first protruding portion of one first electrode conductor of the plurality of first electrode conductors, the second portion is in direct contact with the first part of the second protruding portion of another first electrode conductor of the plurality of first electrode conductors, and the third portion is in direct contact with the passivation layer,
wherein, along the width direction of the body portion, a width of the second electrode conductor is less than a width of each of the first and second protruding portions,
wherein the body portion of each first electrode conductor contacts the silicon substrate by penetrating the passivation layer, and
wherein the plurality of second electrode conductors do not penetrate the passivation layer and are isolated from the silicon substrate.

10. The photovoltaic module according to claim 9, wherein an overlapping area S1 between the first electrode conductor of the plurality of first electrode conductors and the second electrode conductor of the plurality of second electrode conductors accounts for 5% to 25% of a total area of the first electrode conductor of the plurality of first electrode conductors.

11. The photovoltaic module according to claim 10, wherein S1 ranges from 0.001 $\mu m^2$ to 0.05 $\mu m^2$.

12. The photovoltaic module according to claim 9, wherein an area S2 of an orthographic projection of the second electrode conductor of the plurality of second electrode conductors on the silicon substrate ranges from 0.05 $\mu m^2$ to 0.1 $\mu m^2$.

13. The photovoltaic module according to claim 9, wherein an area of an orthographic projection of each of the protruding portions first protruding portion and the second protruding portion on the silicon substrate is S3, an overlapping area between each of the first protruding portion and the second protruding portion and the body portion is S4, and an area of S3 subtracted by S4 ranges from 0.002 $\mu m^2$ to 0.1 $\mu m^2$.

14. The photovoltaic module according to claim 9, wherein an area of an orthographic projection of the body portion on the silicon substrate is S5, and S5 ranges from 0.05 $\mu m^2$ to 0.1 $\mu m^2$.

15. The photovoltaic module according to claim 9, wherein the plurality of first electrode conductors are formed by curing of a firing-through paste, and the plurality of second electrode conductors are formed by curing of a non-firing-through paste.

16. The solar cell according to claim 1, wherein each of the plurality of first electrode conductors forms an ohmic contact with the silicon substrate.

17. The solar cell according to claim 1, wherein each of the plurality of second electrode conductors is offset with respect to the body portion of each of plurality of first electrode conductors in the width direction of the body portion.

18. The solar cell according to claim 1, wherein the surface of the silicon substrate is a textured surface and provided with a diffusion layer having a greater doped concentration than the silicon substrate, and the diffusion layer is passivated by the passivation layer.

* * * * *